United States Patent [19]

Jun et al.

[11] Patent Number: 5,397,743
[45] Date of Patent: Mar. 14, 1995

[54] METHOD OF MAKING A SEMICONDUCTOR DEVICE

[75] Inventors: Young K. Jun; Chang J. Lee, both of Seoul, Rep. of Korea

[73] Assignee: Goldstar Electron Co., Ltd., Rep. of Korea

[21] Appl. No.: 33,043

[22] Filed: Mar. 18, 1993

[30] Foreign Application Priority Data

May 16, 1992 [KR] Rep. of Korea ............... 8292/1992

[51] Int. Cl.⁶ ........................................... H01L 21/44
[52] U.S. Cl. ................................. 437/195; 437/194; 437/228
[58] Field of Search ........................ 437/194, 195, 228

[56] References Cited

U.S. PATENT DOCUMENTS

| | | | |
|---|---|---|---|
| 4,523,372 | 6/1985 | Balda | 437/195 |
| 4,767,724 | 8/1988 | Kim et al. | 437/195 |
| 4,839,311 | 6/1989 | Riley et al. | 437/228 |
| 4,879,257 | 11/1989 | Patrick | 437/195 |
| 4,894,351 | 1/1990 | Batty | 437/195 |
| 4,926,237 | 5/1990 | Sun et al. | |
| 5,006,485 | 4/1991 | Villalon | 437/195 |
| 5,106,779 | 4/1992 | Yu | 437/173 |

OTHER PUBLICATIONS

S. Wolf, *Silicon Processing for the VLSI Era*, vol. 2, Lattice Press, Sunset Beach, CA, 1990, pp. 189–191, 198–199, 204–206, 222–224.

Article entitled "Quarter Micron Hole Filling with SiN Sidewalls by Aluminum High Temperature Sputtering," by M. Taguchi, K. Koyama and Y. Sugano; Jun. 9–10; VMIC Conference, pp. 219–224.

Article entitled "A New Selective W-CVD Process Using Poly Si Glue Layer," by K. K. Choi, Sung B. Hwang, H. L. Park, and C. G. Ko of Hyundai Electronics Industries Co., Ltd., Jun. 9–10, 1992, VMIC Conference, pp. 286–288.

*Primary Examiner*—Brian E. Hearn
*Assistant Examiner*—Michael Trinh
*Attorney, Agent, or Firm*—Poms, Smith, Lande & Rose

[57] ABSTRACT

A method of making a semiconductor device capable of simplifying the overall manufacturing processes and carrying out the reliable interconnections between wires. The method includes forming a first insulator over a semiconductor substrate, forming a first conductor over the first insulator and then patterning the first conductor to form a plurality of first wires, forming a second insulator over the entire exposed surface and then removing a portion of the second insulator disposed over the surface of a selector first wire to form a contact hole, forming a second conductor over the entire exposed surface and then patterning the second conductor to form an interconnection wire over the contact hole, forming a third insulator having uniform thickness and a fourth insulator having the smoothing surface in this order, etching back the third insulator and the fourth insulator, until the surface of the interconnection wire is exposed, and forming a third conductor having an uniform thickness over the entire exposed surface and the then patterning the third conductor to form a second wire to be connected to the selected first wire through the interconnection wire.

12 Claims, 7 Drawing Sheets

METHOD OF MAKING A SEMICONDUCTOR DEVICE

BACKGROUND OF THE INVENTION

1. Field of the Invention

The present invention relates to a method of making a semiconductor device and more particularly to a method capable of carrying out an effective interconnection between wires.

2. Description of the prior art

FIG. 1 is a sectional view showing the structure of a conventional semiconductor device.

According to FIG. 1, a first insulator(2) is formed over the entire surface of a single crystalline substrate(1) by chemical vapour deposition(CVD) method so as to isolate the device regions from wires electrically. A conductor such as aluminum is then formed over the first insulator(2). Conventionally, a plurality of device regions (not shown) are formed at the surface of the single crystaline silicon substrate. A plurality of first wires(3) are formed over the first insulator(2) by patterning the conductor with a photolithography process and an etching process.

Subsequently, over the entire exposed surfaces of the first wires(3) and the first insulator(2), a second insulator (4) for insulating first comes(3) from each other is formed using the CVD method. Thereafter, the second insulator (4) is subjected to the photolithography process and the anisotropic dry etching process, thereby forming a contact hole(5) in the second insulator(4). The contact hole (5), therefore, is the surface area disposed over the surface of a selected first wire (3) when the second insulator (4) is removed. Subsequently, a conductor such as aluminum is formed over the surfaces of the first wire(3) exposed through the contact hole(5) and over the second insulator(4) by a sputtering deposition method. The conductor is patterned by a photolithograply process and an anisotropic dry etching process so as to form a second wire(6) to be connected with the selected first wire(3) through the contact hole(5).

FIG. (2) shows the layout diagram of the semiconductor device corresponding to FIG. (1).

However, a semiconductor device having the above-mentioned conventional structure has the following problems.

First, due to the formation of the contact hole(5), the step coverage of the second wire(6) being formed using the sputtering deposition method becomes worse at a region($K_1$) than at other regions along the second wire(6) is thinner than that of the rest of the regions along the second wire(6) excluding region ($K_1$), the current density at the region($K_1$) is higher than that of the rest of the second wire(6) excluding the region($K_1$) when a power source voltage is applied to the semiconductor device.

Therefore, one problem with a conventionally structured semiconductor is that the second wire(6) may be disconnected, thereby causing the reliability of the semiconductor device to be deteriorated.

Second, the fringe region($K_2$) (shown in FIG. 2) should be formed so as to securely connect the first wire(3) to the second wire(6). Accordingly, the space between the second wires(6) becomes too narrow. So as to overcome the above problems, an alternative method of making another semiconductor device has been suggested. This alternative method of making the semiconductor device will be described in detail hereinafter with reference to FIG. 3a through FIG. 3f.

As shown in FIG. 3a, a single crystalline silicon substrate(31) is first prepared and then a first insulator(32) for electrically isolating the device regions from wires is formed on the single crystalline silicon substrate(31) by the CVD method. Over the entire exposed surface of the first insulator (32), a first conductor (33) and a second conductor (34) are formed in this order by the sputtering deposition method. Thereafter, the first conductor(33) and the second conductor(34) are patterned by the photolithography process and the anisotropic dry etching method such as reactive ion etching (RIE), so as to form uniformly spaced a plurality of patterns(35). Each pattern(35) is comprised of a first conductor component(33a) and a second conductor component(34a).

Thereafter, a photo resist(36) is coated over a selected pattern(35) as shown in FIG. 3c and then the second conductor components(34a) of the non-selected patterns(35) removed by RIE method which is a kind of dry etching method, as shown in FIG. 3d. Thereafter, the photo resist(36) is removed.

At this time, the second conductor component(34a) of the selected pattern(35) serve as an interconnection wire and the first conductor components(33a) of all of the patterns(35) serve as first wires. As shown in FIG. 3e, a second insulator(37) is on the surface of the first insulator(32) to the surface of the second conductor component(34a) of the selected pattern(35) by a bias sputtering deposition method using a quartz target in the argon ambience, so as to electrically isolate the wires from each other.

In this time, because the sputtering of argon gas is generated simultaneously, a thin oxide is formed over the surface of the interconnection wire (the second conductor component 34a of the selected pattern 35). The surface of the interconnection wire is partially removed by the sputtering of argon gas. As a result, the interconnection wire has an inclined plane respectively at both edges of the surface. As shown in FIG. 3f, the oxide formed over the surface of the interconnection wire is removed and then a third conductor (for example aluminum) is formed over the entire surfaces of the second insulator(37) and the connection wire.

By carrying out the photolithograply process and the anisotropic etching process, the third conductor is patterned so as to form a second wire (38) to be connected to the selected first wire(the first conductor component 33a of the selected pattern 35) through the above interconnection wire(the second conductor component 34a of the selected pattern 35).

FIG. 4 is a perspective view showing a semiconductor device corresponding to FIG. 3d.

However, the above-mentioned alternative method of conventional art has the following problems. First, as shown in FIG. 3b, the first conductor(33) should be etched with an etching gas such as $CF_4$ or $SF_6$ and the second conductor(34) should be etched with an etching gas such as $Cl_2$.

In other words, because the materials of the first conductor(33) and the second conductor(34) are different each other, there is an inconvenience that the etching gas should be changed in accordance with the kind of the material to be etched.

Furthermore, if the change time of the etching gas is not accurate, the shape of the first wires will be formed irregularly.

Second, so as to obtain the first conductor component(33a) of the selected pattern(35) shown in FIG. 4 representing a perspective view of FIG. 3d, the first conductor(33) should be subjected to the anisotropic dry etching process twice, thereby causing the surface of the first conductor component(33a) to be damaged.

Furthermore, since the second conductor should be also subject to the anisotropic etching process twice so as to obtain the second conductor component(34a) of the patterns(35), the scraps of the second conductor (34) may remain during the dry etching processes, thereby causing the reliability of produced semiconductor device to be deteriorated.

SUMMARY OF THE INVENTION

Therefore, an object of the invention is to overcome the above-mentioned problems encountered in the prior arts and to provide a method of making a semiconductor device capable of simplifying the overall manufacture process and carrying out a reliable interconnection between wires.

In accordance with one embodiment of the invention, a single crystalline silicon substrate in which device regions are formed at the surface is first prepared.

A first insulator having an uniform thickness is formed over the surface of the single crystalline silicon substrate and then a first conductor having an uniform thickness is formed over the surface of the first insulator. The first conductor is patterned to form a plurality of uniformly spaced first wires. A second insulator having an uniform thickness is formed over the entire exposed surfaces of the first wire and the first insulator and then a portion of the second insulator which is formed over the selected first wire is removed, to form a contact hole for partially exposing the surface of the first wire in the second insulator.

Over the entire surfaces of the selected first wire and the second insulator, a second conductor is formed with uniform thickness and then the second conductor is patterned, to form an interconnection wire over the contact hole. The width of the interconnection wire is a little wider than that of the contact hole and a little narrower than that of the selected first wire.

Over the entire surface of the interconnection wire and the second insulator, a third insulator having uniform thickness and a fourth insulator having the planar surface are formed in this order. The third insulator and the fourth insulator are uniformly etched back from the planar surface of the fourth insulator to the surface of the interconnection wire to expose the surface of the interconnection wire. Over the entire exposed surfaces of the interconnection wire and the remaining third insulator and fourth insulator, a third conductor having uniform thickness is formed and then the third conductor is patterned to form a second wire to be connected to the first wire through the interconnection wire.

BRIEF DESCRIPTION OF THE DRAWINGS

Other objects and aspects of the invention will become apparent from the following description of embodiments with reference to the accompanying drawing in which.

DETAILED DESCRIPTION OF THE PREFERRED EMBODIMENTS

Referring to FIG. 5a to FIG. 7, there are illustrated three embodiments of the present invention which will be described hereinafter.

First Embodiment

FIG. 5a to 5h illustrate a method of making a semiconductor device in accordance with a first embodiment of the present invention.

Figure 1:
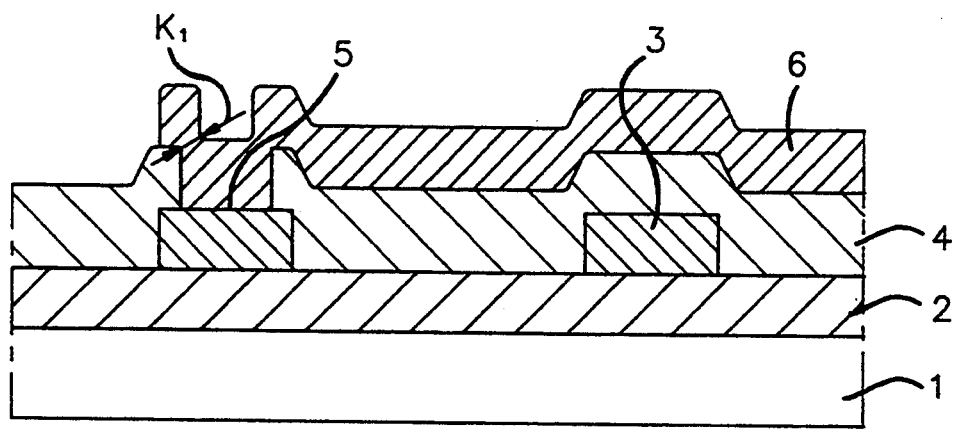
FIG. 1 is a sectional view showing the structure of a conventional semiconductor device.
Figure 2:
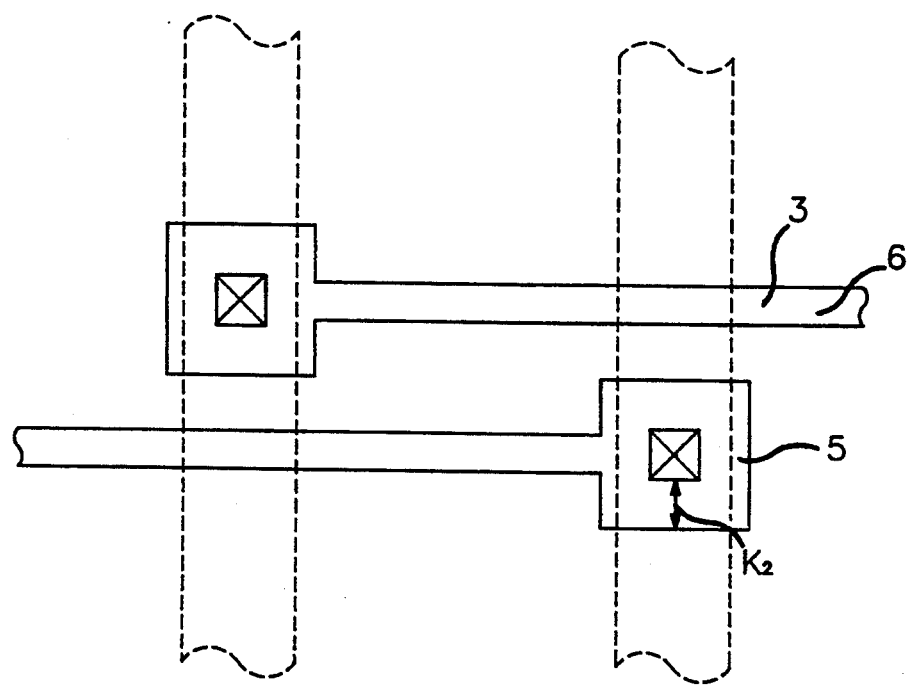
FIG. 2 is a layout diagram of FIG. 1.
Figure 3A:
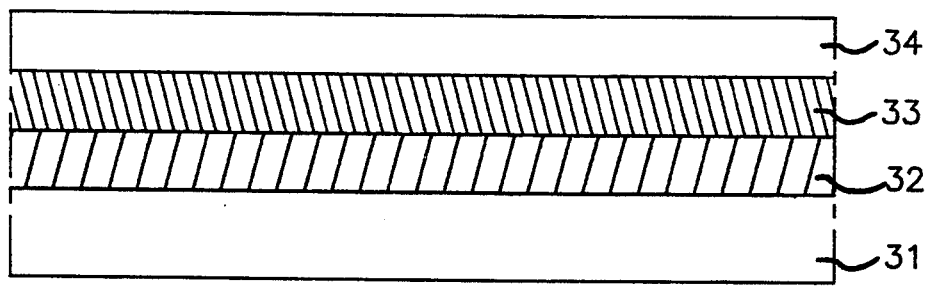
FIG. 3a to 3f are sectional views illustrating an alternative method of making another conventional semiconductor device.
Figure 3B:
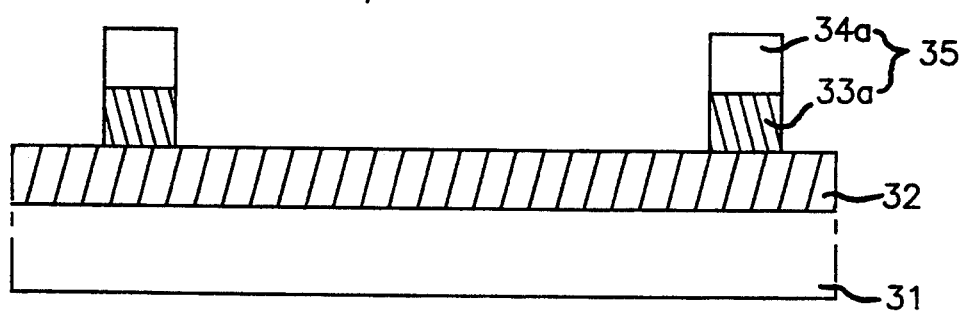
Figure 3C:
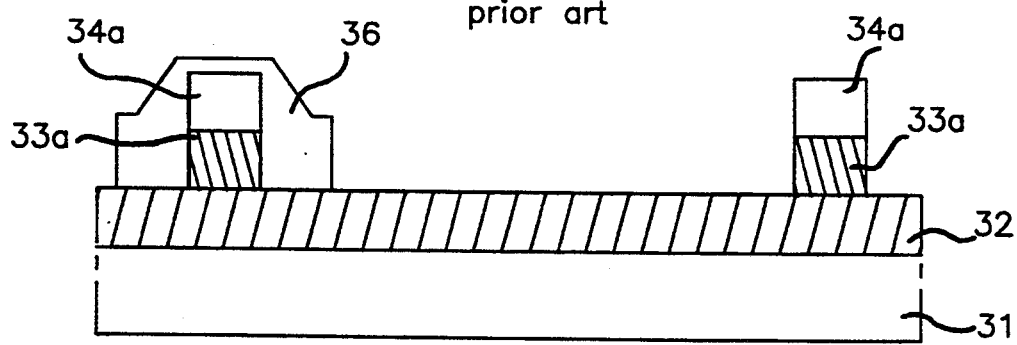
Figure 3D:
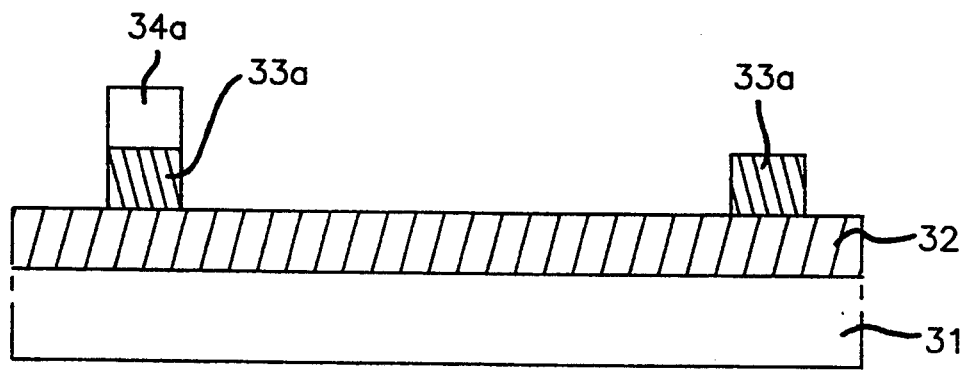
Figure 3E:
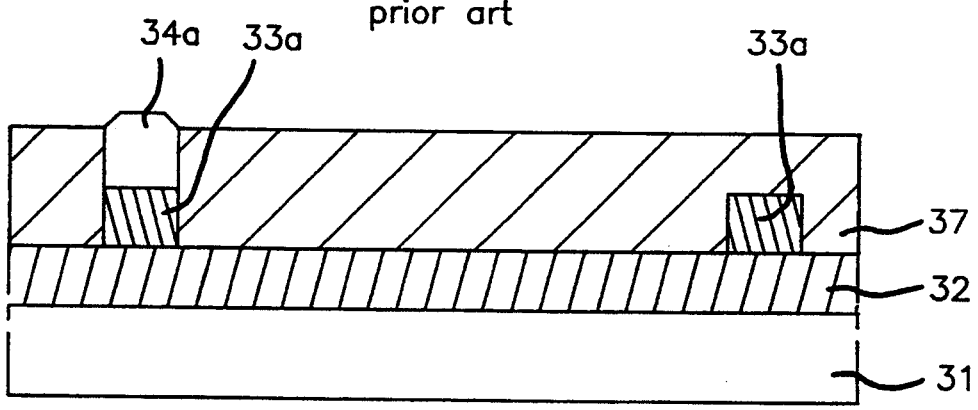
Figure 3F:
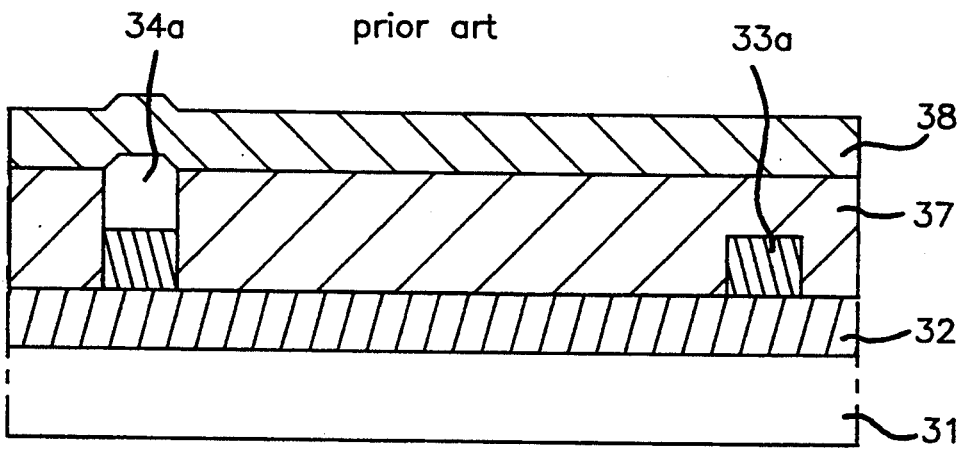
Figure 4:
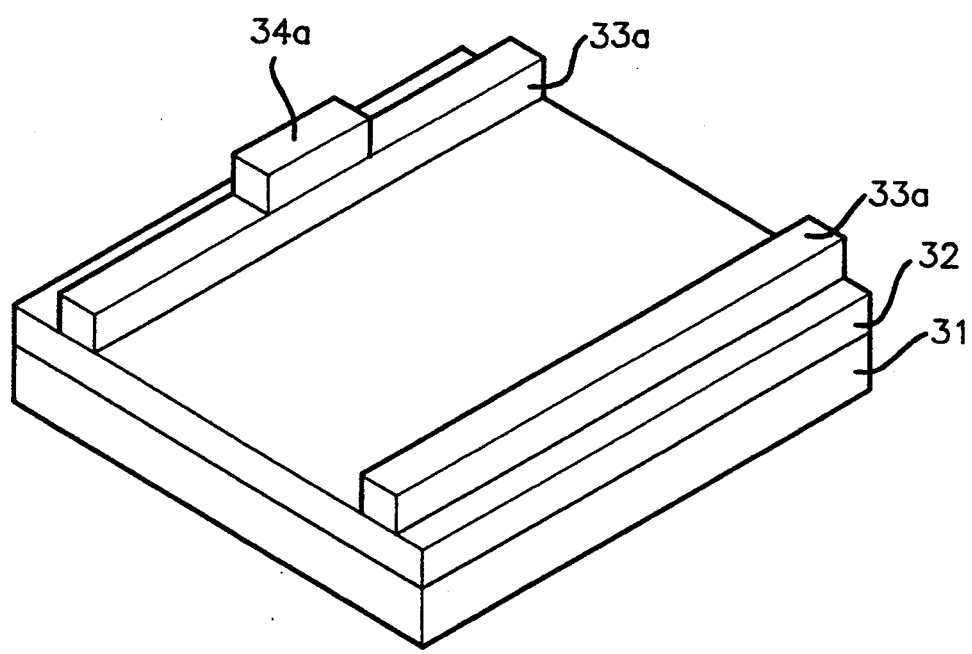
FIG. 4 is a perspective view of FIG. 3d.
Figure 5A:
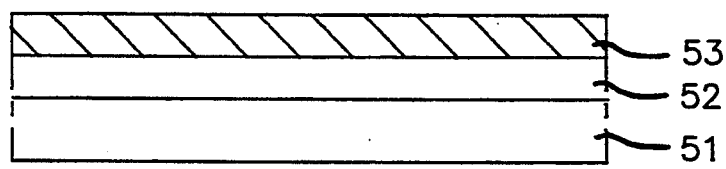
FIG. 5a to 5h are sectional views illustrating a method of making a semiconductor device in accordance with a first embodiment of the present invention.

As shown in FIG. 5a, over a single crystalline silicon substrate(51), a first insulator(52) having an uniform thickness is first formed by a CVD method so as to insulate the single crystalline silicon substrate (51) from wires. The first conductor(52) having an uniform thickness of 0.4 $\mu$m to 0.8 $\mu$m is formed over the entire surface of the first insulator(52) by a sputtering deposition method.

Conventionally, a plurality of device regions(not shown) are formed at the surface of the single crystalline silicon substrate(51).

In this embodiment, an oxide is used as a material of the first insulator(52) and an aluminum alloy is used as a material of the first conductor (53).

Figure 5B:
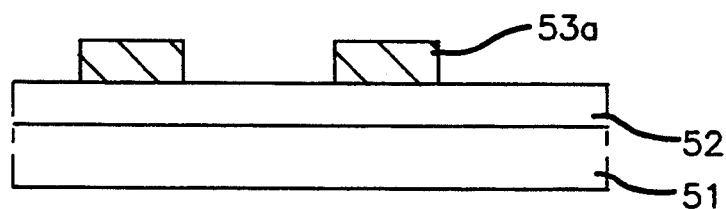
Figure 5C:
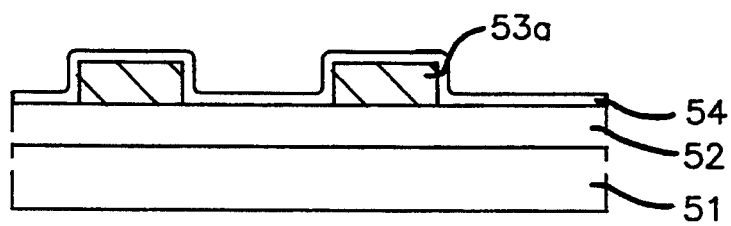

As shown in FIG. 5b, the first conductor(53) is patterned by a photolithography process and an anisotropic etching process so as to form a plurality of uniformly spaced first wires (53a).

Thereafter, a second insulator(54) (for example, oxide) having an uniform thickness smaller than 0.5 $\mu$m is formed over the entire surface of the first wires (53a) and the first insulator(52), as shown in FIG. 5b.

Figure 5D:
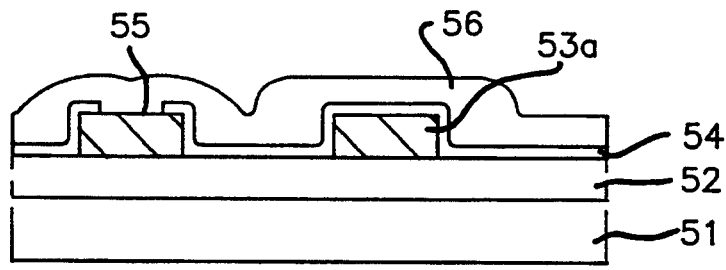

As shown in FIG. 5d, the second insulator(54) is subjected to a patterning process for removing a portion of the second insulator 54 which is disposed over the surface of a selected first wire(53a), thereby forming an contact hole(55) in the second insulator(54). The patterning process is comprised of a photolithography process and an anisotropic dry etching process. Subsequently, over the surfaces of the first wire(53a) exposed through the contact hole(55) and the second insulator(54), a second conductor (56) is formed by the sputtering deposition method. The second conductor(56), for example, is a metal such as silicide having a high melting point or aluminum alloy.

Figure 5E:
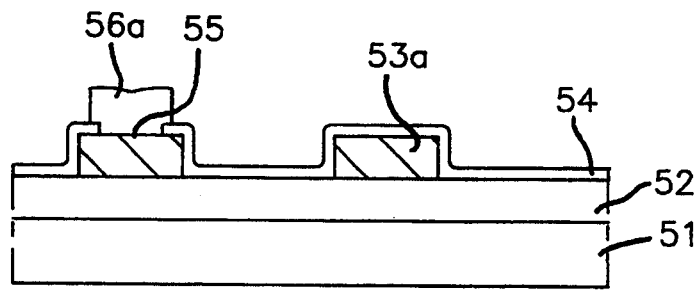

As shown in FIG. 5e, the second conductor(56) is patterned by a photolithography process and an anisotropic dry etching process, to form a interconnection wire(56a). At this time, the interconnection wire(56a) is formed only over the contact hole(55). The width of the interconnection wire(56a) is determined as a magnitude a little larger than that of the contact hole (55) so that it has sufficient contact with the surface of the first wire(53a) exposed through the contact hole (55).

Figure 5F:
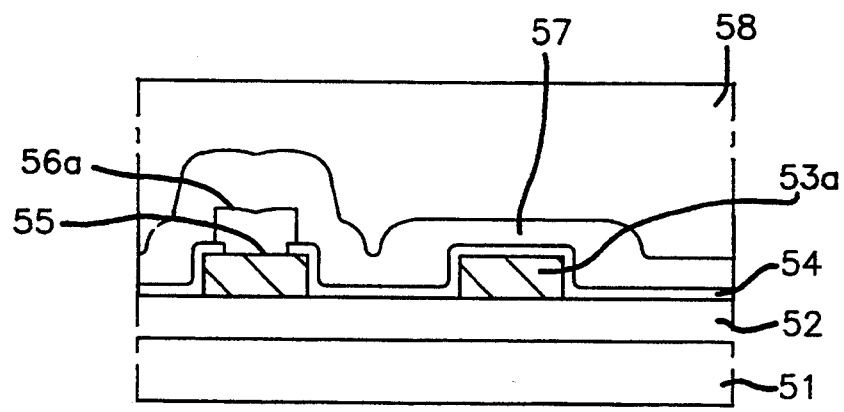

Subsequently, as shown in FIG. 5f, a third insulator(57) (for example, oxide) is formed over the surfaces of the interconnetion wire(56a) and the second insulator(54) with an uniform thickness by a CVD method and then a fourth insulator (58) having an even surface (for example, oxide or polyimide) is formed over the third insulator(57).

Figure 5G:
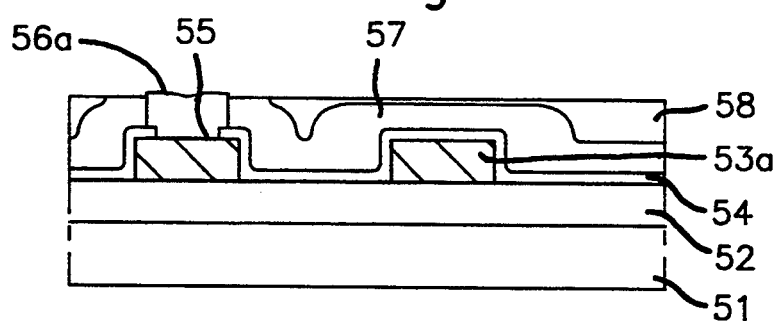
Figure 5H:
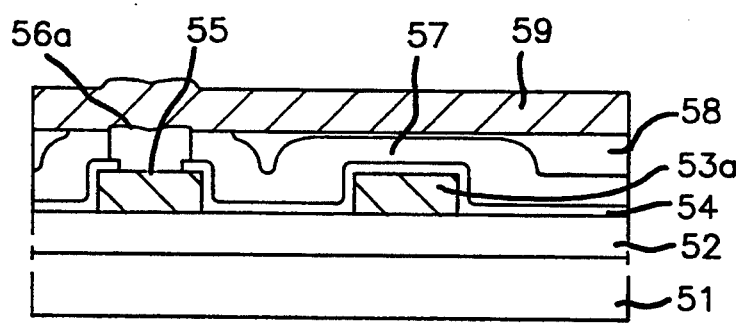

As shown in FIG. 5g, the third insulator(57) and the fourth insulator (58) are etched back until the surface of the interconnection wire(56a) is exposed. At this time, $CF_4$ or $CHF_3$ is used as an etching gas for etching back the third insulator(57) and the fourth insulator(58). Subsequently, over the surfaces of the remaining third insulator(57) and the remaining fourth insulator(58) and the surface of exposed interconnection wire (56a), a third conductor(for example, aluminum alloy) is formed by a sputtering deposition method and then the third conductor is patterned by a photolithography process and an anisotropic dry etching method, to form a second wire(59), as shown in FIG. 5h. The second wire(59) is connected to the first wire(53a) through the interconnection wire (56a).

Figure 6:
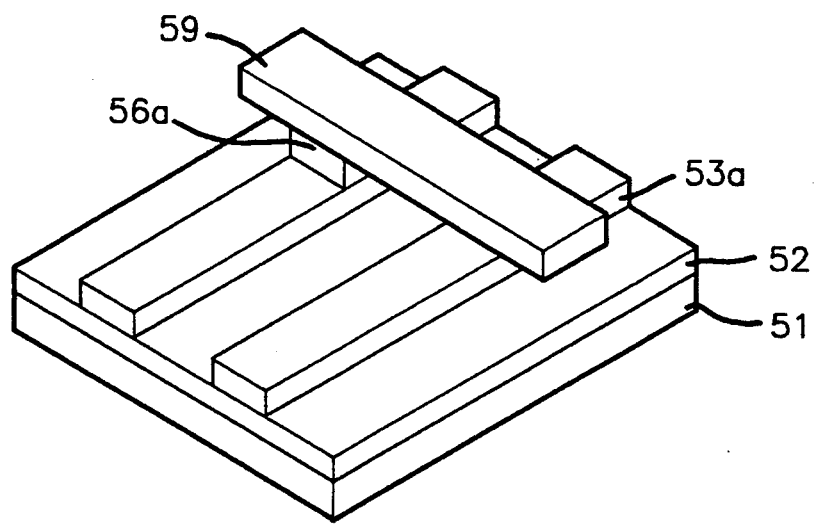
FIG. 6 is a perspective view showing the major parts of the semiconductor device corresponding to FIG. 5h.

FIG. 6 is a perspective view showing the major parts of the semiconductor device corresponding to FIG. 5h.

According to FIG. 6, the second wire(59) is connected to the selected first wire(53a) through the interconnection wire(56a) and is arranged orthogonally to the first wire(53a).

Second Embodiment

Hereinafter, a method of making a semiconductor device in accordance with a second embodiment of the present invention will be described with reference to FIG. 5d and FIG. 7.

The second embodiment is almost the same as the processes of FIG. 5a through FIG. 5h showing the first embodiment, with the exception of FIG. 5d.

Figure 7:
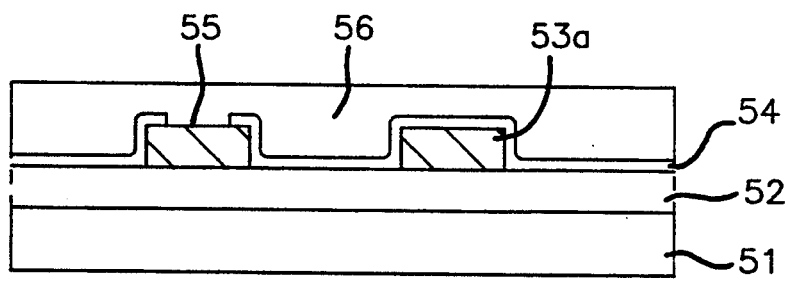
FIG. 7 is a sectional view illustrating a method of making a semiconductor device in accordance with a second embodiment of the present invention.

As shown in FIG. 5d, a second conductor(56) is formed over the surfaces of the second insulator(54) and the first wire(53a) exposed through the contact hole(55) and then the second conductor(56) is subjected to an thermal processing, thereby enabling the surface of the second conductor(56) to be smoothed, as shown in FIG. 7. The thermal processing is carried out in a gas atmosphere including $H_2$ or an inert gas with a temperature lower than the melting point of the second conductor (56) in order to cause viscous flow of the second conductor.

Other subsequent processes are the same as those of the first embodiment illustrated FIG. 5e to FIG. 5h and their detailed description is omitted here but incorporated by reference.

Third Embodiment

Hereinafter, a method of making a semiconductor device in accordance with a third embodiment of the present invention will be described with reference to FIG. 5f and FIG. 8.

The third embodiment is almost same as the processes of FIG. 5a through FIG. 5h showing the first embodiment with the exception of FIG. 5f.

As shown in FIG. 5f, several step shaped portions having a large height may be formed at the surface of the third insulator(57) due to the height of the interconnection wire(56a) formed over the surface of the first wire(53a). Furthermore, several crevices may be also generated between the step shaped portions at the surface of the third insulator(57). Substantially, it is difficult to form the fourth insulator(58) having the smoothing surface due to the crevices.

Figure 8:
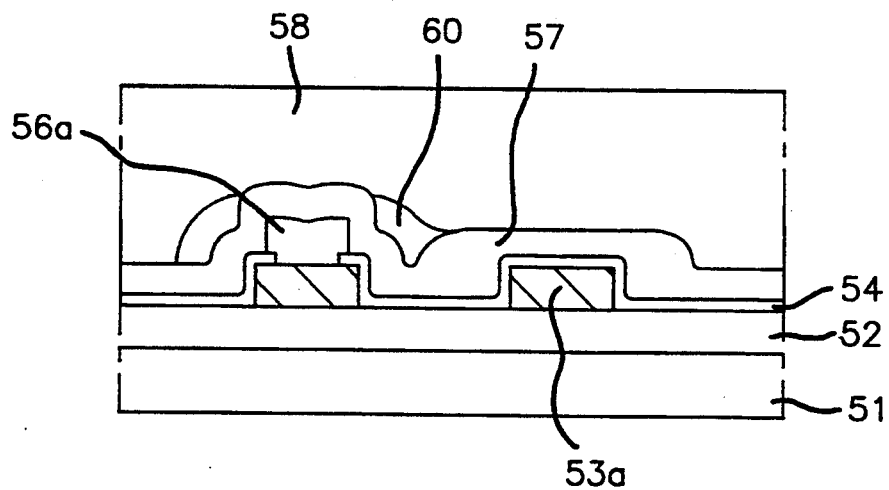
FIG. 8 is a sectional view illustrating a method of making a semiconductor device in accordance with a third embodiment of the present invention.

According to the third embodiment, so as to solve the above-problem, a fifth insulator is formed over the third insulator(57) by a CVD method and then the fifth insulator is subjected to an anisotopic dry etching process, thereby forming side wall insulators(60) at the crevices between the step shaped portions and the side walls of the step shaped portions, as shown in FIG. 8.

The side wall insulators(60) contribute to fill the crevices and to reduce the heights of the step shaped portions.

Thereafter, the fourth insulator(58) having the smoothing surface is formed over the surfaces of the exposed third insulator(57) and the side wall insulators(60) by the TEOS method. The TEOS method is carried out in an atmosphere of $O_3$ under a normal pressure. As a result, since the heights of the step shaped portions are largely reduced, it is possible to easily form the fourth insulator(58) having the smoothing surface.

As apparent from the above description, the present invention provides the following effects.

First, as described in the first embodiment, if aluminum alloy is used as a material of the second conductor(56), the first wire(53a), the interconnection wire(56a); and the second wire (59) are all made of aluminum alloy. Therefore, the processes for forming these wires can be carried out using a single apparatus, thereby simplifying the process of producing a semiconductor device to be simplified. According to the conventional art, there was a necessary inconvenience that etching gas would have to be changed in accordance with the kind of the material to be etching. Therefore, the etching apparatus would have to be changed in accordance with the etching gas. The present invention has eliminated this inconvenience.

Second, since the interconnection wire has the smoothing surface, the second wire is ensurely connected to the selected first wire through the interconnection wire.

Third, since the second insulator(54) is formed with a thickness under 0.5 $\mu$m, the second conductor formed over the contact hole(55) with an improved step coverage. Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method of making a semiconductor device, comprising the steps of:
   forming a first insulator having a uniform thickness on a semiconductor substrate;
   forming a first conductor having a uniform thickness on the first insulator and then patterning the first conductor to form a plurality of first wires;
   forming a second insulator on the entire surface and then removing a portion of the second insulator disposed on the surface of a selected one of said first wires, to form a contact hole;
   forming a second conductor on the entire exposed surface and then patterning the second conductor to form an interconnection wire in the contact hole, wherein the width of the interconnection wire is wider than that of the contact hole and narrower than that of the selected first wire;

forming a third insulator having a uniform thickness and having crevices;

after said third insulator forming step, forming a fourth insulator having a smoothing surface;

before said fourth insulator forming step, forming a fifth insulator on surfaces of the third insulator;

subjecting the fifth insulator to an anisotropic dry etching process to form a side wall insulator in the crevices of the third insulator, thereby enabling the crevices to be filled and enabling the heights of step-shaped portions of the third insulator to be reduced;.

etching back uniformly the third insulator and the fourth insulator, until the surface of the interconnection wire is exposed; and forming a third conductor having a uniform thickness on the entire exposed surface and then patterning the third conductor to form a second wire to be connected to the selected first wire through the interconnection wire.

2. A method in accordance with claim 1, wherein the first conductor, the second conductor and the third conductor are all a sputtered aluminum alloy.

3. A method in accordance with claim 1, wherein the second conductor is a sputtered silicide having a high melting point.

4. A method in accordance with claim 1, the second conductor has a thickness smaller than 0.5 $\mu$m.

5. A method in accordance with claim 1, wherein the first insulator the second insulator, and the third insulator are all a CVD oxide.

6. A method in accordance with claim 1, the fourth insulator having the smoothing surface is one of an oxide and a polyimide.

7. A method in accordance with claim 6, wherein the wherein the third insulator is made by TEOS.

8. A method in accordance with claim 1, further comprising the step of smoothing the surface of the second conductor by carrying out a thermal treatment process prior to said patterning the second conductor step.

9. A method in accordance with claim 8, wherein the thermal treatment process is carried out at a temperature lower than the melting point of the second conductor in an inert gas atmosphere.

10. A method in accordance with claim 8, wherein the thermal treatment process is carried out at a temperature lower than the melting point of the second conductor in a gas atmosphere including $H_z$.

11. A method in accordance with claim 1, wherein the fifth insulator is a CVD oxide.

12. A method in accordance with claim 1, wherein the semiconductor substrate is made of a single crystalline silicon.

* * * * *